United States Patent
Patil et al.

(10) Patent No.: US 9,396,995 B1
(45) Date of Patent: Jul. 19, 2016

(54) MOL CONTACT METALLIZATION SCHEME FOR IMPROVED YIELD AND DEVICE RELIABILITY

(71) Applicant: GLOBALFOUNDRIES Inc., Grand Cayman (KY)

(72) Inventors: Suraj K. Patil, Ballston Lake, NY (US); Min-hwa Chi, Malta, NY (US); Garo Derderian, Saratoga Springs, NY (US); Wen-Pin Peng, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/634,080

(22) Filed: Feb. 27, 2015

(51) Int. Cl.
  *H01L 21/768* (2006.01)
  *H01L 21/285* (2006.01)
  *H01L 21/02* (2006.01)
  *H01L 21/263* (2006.01)
  *H01L 21/3065* (2006.01)
  *H01L 21/265* (2006.01)
  *H01L 29/49* (2006.01)

(52) U.S. Cl.
  CPC ...... *H01L 21/76877* (2013.01); *H01L 21/0214* (2013.01); *H01L 21/02126* (2013.01); *H01L 21/02167* (2013.01); *H01L 21/2633* (2013.01); *H01L 21/26586* (2013.01); *H01L 21/28556* (2013.01); *H01L 21/3065* (2013.01); *H01L 21/7684* (2013.01); *H01L 21/76843* (2013.01); *H01L 21/76864* (2013.01); *H01L 29/4975* (2013.01)

(58) Field of Classification Search
  CPC ............ H01L 21/76877; H01L 21/76843; H01L 21/2633; H01L 21/02167; H01L 21/0214; H01L 21/28556; H01L 21/26586; H01L 21/02126; H01L 21/3065; H01L 21/7684; H01L 21/76864; H01L 29/4975
  USPC ......................................... 438/655
  See application file for complete search history.

(56) References Cited

U.S. PATENT DOCUMENTS

| | | | | |
|---|---|---|---|---|
| 5,674,787 A * | 10/1997 | Zhao | ............... | H01L 21/288 257/E21.174 |
| 8,512,586 B2 | 8/2013 | Tabat et al. | | |
| 2003/0073314 A1 * | 4/2003 | Skinner | ............. | H01L 21/02063 438/689 |
| 2010/0025365 A1 * | 2/2010 | Tabat | ............. | C23C 16/04 216/37 |
| 2014/0264641 A1 * | 9/2014 | Frohberg | ............. | H01L 29/4175 257/412 |
| 2015/0243565 A1 * | 8/2015 | Nieh | ............. | H01L 21/823871 257/369 |
| 2015/0311221 A1 * | 10/2015 | Huang | ............. | H01L 21/283 257/314 |

* cited by examiner

*Primary Examiner* — Caleen Sullivan
(74) *Attorney, Agent, or Firm* — Ditthavong & Steiner, P.C.

(57) ABSTRACT

A method of forming a metalized contact in MOL is provided. Embodiments include forming a TT through an ILD down to a S/D region; forming a SiOC, SiCN, or SiON layer on side surfaces of the TT; performing a GCIB vertical etching at a 0° angle; implanting Si into the TT by an angled PAI; removing a portion of the TT by Ar sputtering and a remote plasma assisted dry etch process; forming NiSi on the S/D region at the bottom of the TT; and filling the TT with contact metal over the NiSi.

17 Claims, 9 Drawing Sheets

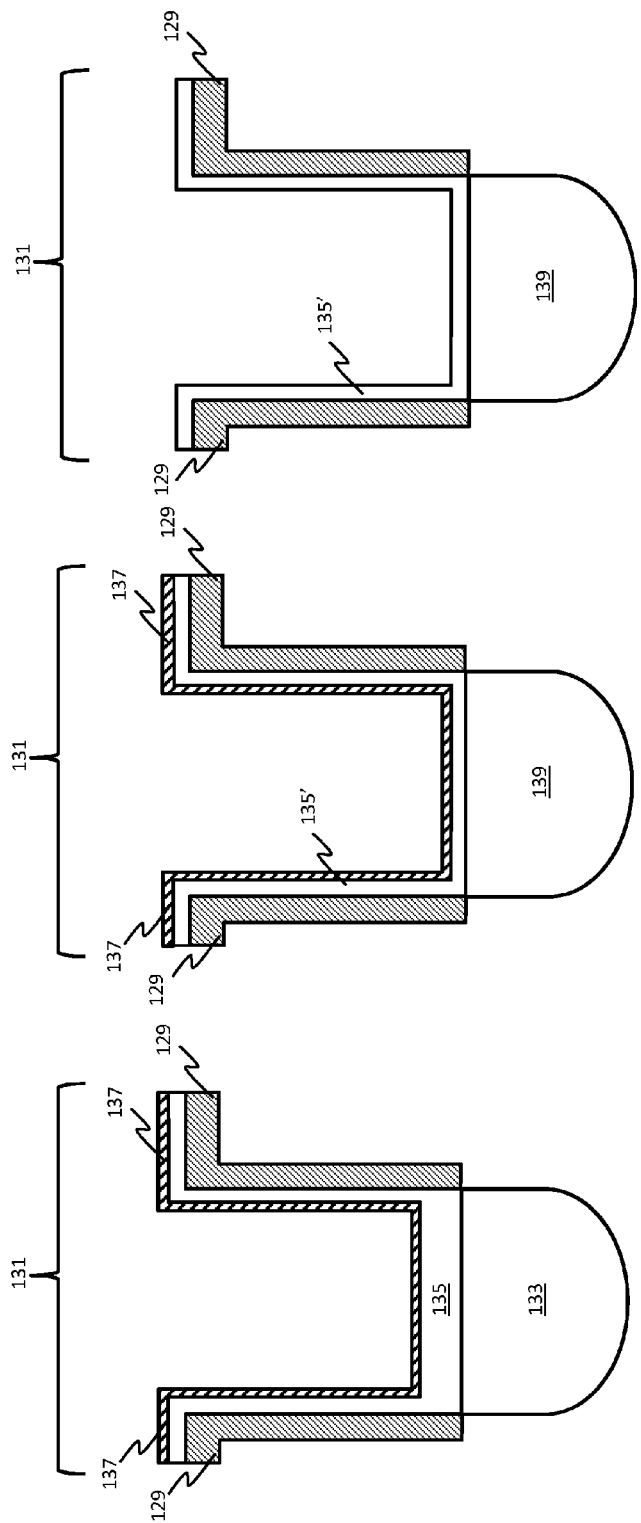

MOL CONTACT METALLIZATION SCHEME FOR IMPROVED YIELD AND DEVICE RELIABILITY

TECHNICAL FIELD

The present disclosure relates to a manufacture of source/drain (S/D) contacts for semiconductor devices. The present disclosure is particularly applicable to sub-20 nanometer (nm) technology nodes and beyond.

BACKGROUND

Currently, plasma vapor deposition (PVD) titanium (Ti), atomic layer deposition (ALD) titanium nitride (TiN) with chemical vapor deposition (CVD) tungsten (W) are industry standards for S/D contract fill for sub-20 nm nodes. A known flow for contact metallization is depicted in FIG. 1A. In step 101, a contact (referred to as a trench contact (TT)) is formed through an interlayer dielectric layer (ILD) down to S/D regions by reactive ion etching (RIE). In step 103, a silicon oxycarbide (SiOC) layer is formed on side surfaces of the TT. An argon (Ar) sputter process is then performed in step 105 followed by a silicon (Si) implantation into the TT by angled pre-amorphous implantation (PAI) in step 107. In step 109, a portion of the TT is removed by Ar sputtering, which is then followed by a remote plasma assisted dry etch process, e.g., SiCoNi™, to remove native oxide on the bottom of the trench prior to silicide formation.

In steps 111 through 117, nickel silicide (NiSi) is formed in the TT on the S/D region. In step 111, nickel platinum ($Ni_{1-x}Pt_x$), where x ranges from 5 to 50 atomic weight (at. wt.) %, is deposited in the TT to a thickness of 150 angstroms (Å) to 200 Å by PVD and TiN is also deposited in the TT to a thickness of 32 Å. In steps 113 and 115, a rapid thermal anneal (RTA) is performed, which is then followed by a strip process. In step 117, a second RTA (Flash or laser-based surface anneal (LSA)) is performed, then followed by a second strip process.

In steps 119 through 127, the TT is filled with a contact metal. In step 119, an Ar sputtering is performed. In step 121, a Ti layer is deposited by PVD in the TT to a thickness of 50 Å to 60 Å. Thereafter, in step 123, a second layer of TiN is formed in the TT by atomic layer deposition (ALD). The second layer of TiN is formed to a thickness of 32 Å. In step 125, the remainder of the TT is filled with W, for example to a thickness of 1500 Å to 2000 Å. In step 127, the W is planarized, e.g., by chemical mechanical polishing (CMP).

FIGS. 1B through 1F schematically illustrate the current contact metallization flow in middle-of-line (MOL) process discussed above to form a TT 131 with respect to FIG. 1A. Adverting to FIG. 1B, a SiOC layer 129 is formed on side surfaces of a TT 131. An Ar sputter process is then performed followed by a Si implantation into the TT by angled PAI, forming the Si PAI layer 133. A portion of the TT 131 is removed by Ar sputtering, which is then followed by a SiCoNi™ etch to clean the bottom of the TT 131 prior to silicide formation. Next, a NiPt layer 135 is deposited in the TT, for example, to a thickness of 150 Å, and a TiN layer 137 is also deposited in the TT, for example, to a thickness of 50 Å.

Adverting to FIG. 1C, a RTA is performed which produces a $Ni_xSi_y$ layer 139 and an unreacted NiPt layer 135'. The TiN layer 137 is then stripped, as depicted in FIG. 1D. After the TiN layer 137 is stripped, a second RTA is performed, which forms a NiSi layer 139', as depicted in FIG. 1E. Thereafter, the NiPt layer 135 is stripped. Adverting to FIG. 1F, a Ti layer 141 is deposited by PVD in the TT 131 to a thickness of 50 Å to 60 Å. Next, a TiN layer 143 is formed in the TT 131 by ALD. Thereafter, the remainder of the TT 131 is filled with a W layer 145. Consequently, a void 147 is formed as a result of necking.

As technology scaling requires contact critical dimension (CD) continuously reduced with high aspect ratios, contact etching, contact pre-clean prior to silicide formation as well as metal filling in contacts becomes more difficult. The contact etching needs to have minimum lateral etching and high selectivity so that the contact CD is not "blown-up," which may lead to TT to gate shorts and degradation of transistor overlap and effective capacitance. Furthermore, inadequate clean (pre-clean) prior to silicide formation on the bottom of TT hinders silicide formation which in-turn leads to the TT being open due to silicide missing or high resistance silicide-S/D contacts due to thin silicide. However, increasing pre-clean would lead to further CD blow-out of TT. In addition, W-gapfill issues in the contact module lead to W-voids, line voids, and missing contacts, which are a major device and yield inhibitor. CVD W films (bulk) also have a large grain structure, which makes gap-fill and polishing challenging. Further, improper W fill in the contacts can lead to increased resistance of contacts, i.e., a serious degradation of yield and device performance.

A need therefore exists for methodology enabling an integration scheme for maintaining small contact CD by minimizing lateral contact etching, enhancing NiSi formation, and improving W-gapfill, and the resulting device.

SUMMARY

An aspect of the present disclosure is a method of forming a metal contact in MOL process.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a TT through an interlayer dielectric (ILD) down to a S/D region; forming a SiOC, silicon carbon nitride (SiCN), or silicon oxynitride (SiON) layer on side surfaces of the TT; performing a gas cluster ion beam (GCIB) vertical etching at a 0° angle; implanting Si into the TT by an angled PAI; removing a portion of the TT by Ar sputtering followed by a remote plasma assisted dry etch process; forming NiSi on the source/drain region at the bottom of the TT; and filling the TT with contact metal over the NiSi.

Aspects of the present disclosure include forming the TT by RIE. Other aspects include forming the NiSi layer by: depositing NiPt in the TT by PVD; depositing TiN in the TT; and performing a first RTA and a second RTA. Further aspects include filling the TT with contact metal by: performing Ar sputtering; forming a Ti layer in the TT by PVD; forming a TiN layer in the TT by ALD; filling a remainder of the TT with W; and planarizing the W. Another aspect includes filling the TT with contact metal by: performing Ar sputtering with GCIB; forming a TiN layer in the TT by ALD; filling a remainder of the TT with W; and planarizing the W.

Another aspect of the present disclosure is a method including: forming a TT through an ILD down to a S/D region; forming a SiOC, SiCN, or SiON layer on side surfaces of the TT; performing a first GCIB etching at a 0° angle;

implanting Si into the TT by an angled PAI; performing a second GCIB etching; depositing NiPt in the TT by PVD; depositing TiN in the TT; filling a remainder of the TT with W and performing a RTA and a LSA.

Aspects of the present disclosure include forming the TT by RIE. Other aspects include performing the second GCIB etching with a remote plasma assisted dry etch process. Further aspects include forming the NiPt layer to a thickness of 50 Å to 60 Å. Another aspect includes filling the TT with W at a temperature of 250° C. to 400° C. Additional aspects include filling the TT with W at the temperature for 150 second (s) to 300 s. Other aspects include performing the laser based RTA at 700° C. to 850° C. for 0.25 milliseconds (ms) to 1.0 ms. Further aspects include planarizing the W before performing the RTA and LSA. Another aspect includes planarizing the W after the RTA and LSA.

A further aspect of the present disclosure is a method including: forming a TT in a substrate by GCIB etching at a 0° angle; implanting Si into the TT by an angled PAI; performing a second GCIB etching; depositing NiPt in the TT by PVD; depositing a TiN layer on side surfaces of the TT; filling the TT with W; planarizing the W; and performing RTA and LSA.

Aspects of the present disclosure include performing the second GCIB etching with a remote plasma assisted dry etch process. Other aspects include depositing the NiPt to a thickness of 50 Å to 60 Å. Further aspects include filling the TT with W at a temperature of 250° C. to 400° C. Another aspect includes filling the TT with W at the temperature for 150 s to 300 s. Additional aspects include performing the RTA at 700° C. to 850° C. for 0.25 ms to 1.0 ms.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1B through 1F schematically illustrate the current MOL contact metallization flow of FIG. 1A;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of "blow-up" of contact CDs from lateral etching, "volcano" defects and Ti attack by fluorine (F) during W deposition, and increased resistance of contact and line resistance from a Ti film in the contact stack attendant upon forming a MOL trench silicide and metalized TT contact.

Methodology in accordance with embodiments of the present disclosure includes a TT formed through an ILD down to a source/drain region. A SiOC, SiCN, or SiON layer is formed on side surfaces of the TT. GCIB vertical etching is performed at a 0° angle. Si is implanted into the TT by an angled PAI. A portion of the TT is removed by Ar sputtering followed by a remote plasma assisted dry etch process. NiSi is formed on the source/drain region at the bottom of the TT, and then the TT is filled with contact metal of W over the NiSi.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
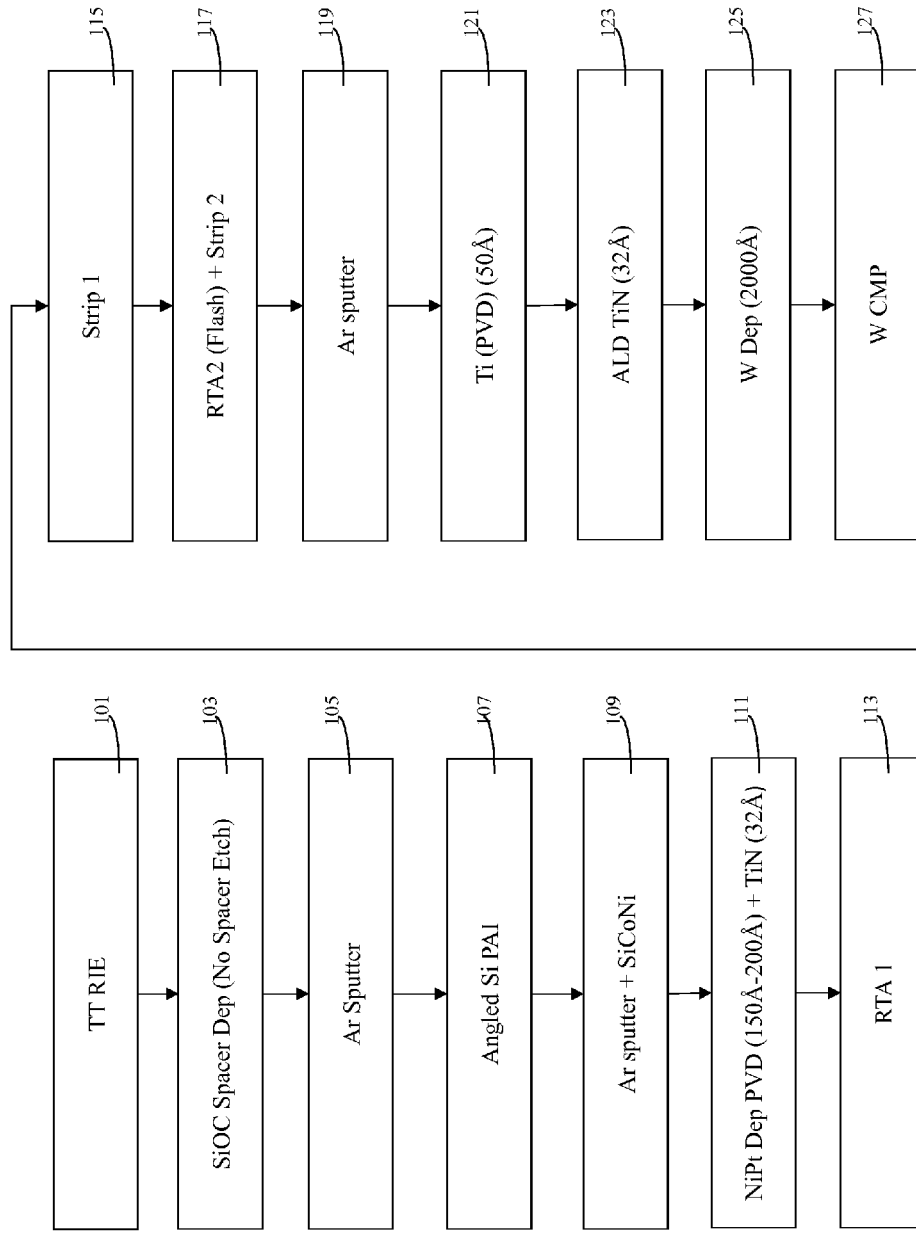
FIG. 1A illustrates a current contact metallization flow in MOL.
Figure 1F:
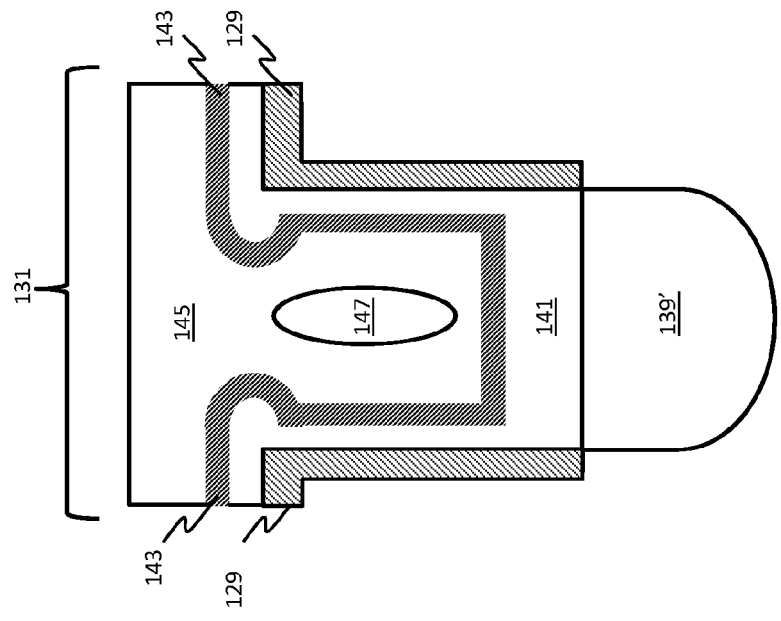
Figure 1E:
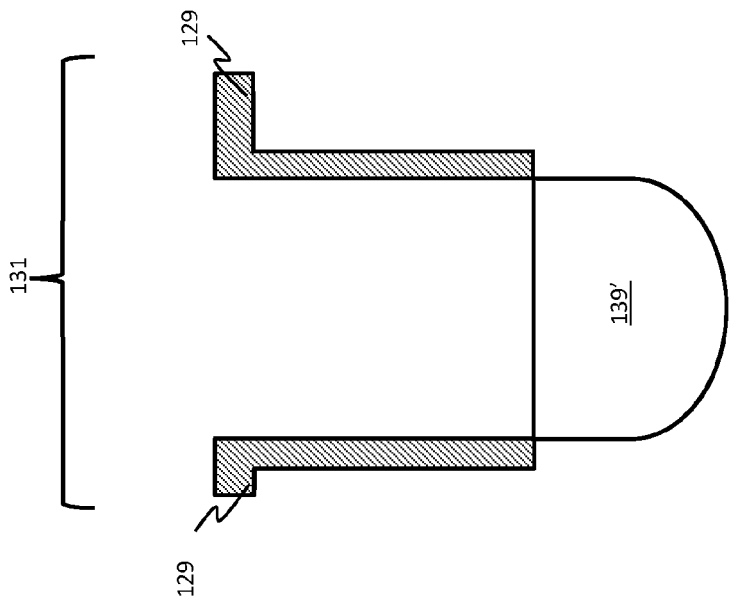
Figure 2:
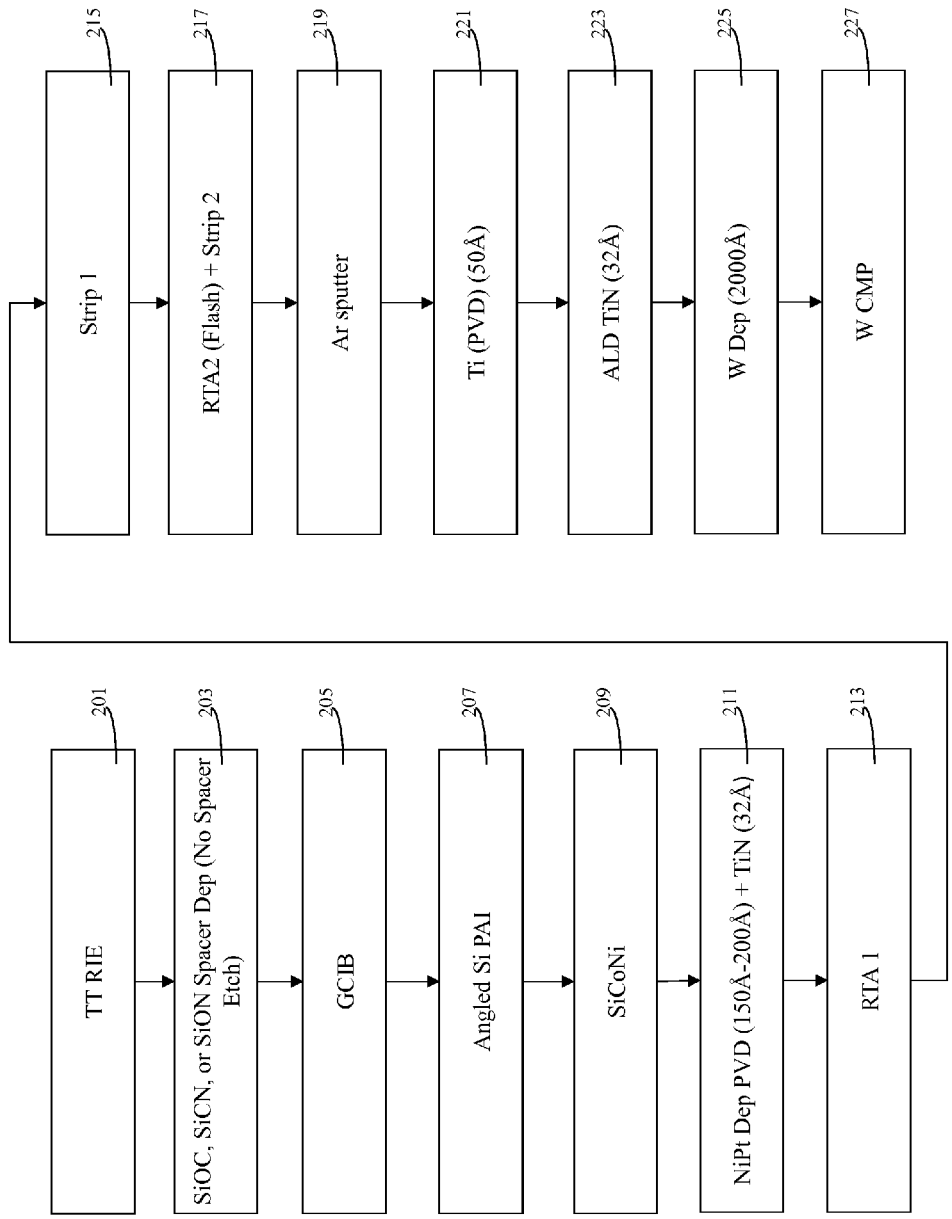
FIG. 2 illustrates a contact metallization flow in MOL with a contact etch scheme to minimize lateral etching, in accordance with an exemplary embodiment.

FIG. 2 illustrates a contact metallization flow in MOL with a contact etch scheme to minimize lateral etching, in accordance with an exemplary embodiment. In step 201, similar to step 101 of FIG. 1A, a TT is formed through an ILD down to S/D regions by RIE. In step 203, a SiOC, SiCN, or SiON layer is formed on side surfaces of the TT. In step 205, unlike in step 105 of FIG. 1A, a GCIB vertical etching is performed at a 0° angle. The GCIB contains chemically reactive gas, such as, but not limited to, silicon tetrafluoride ($SiF_4$), silane ($SiH_4$), tetrafluoromethane ($CF_4$), trifluoromethane ($CHF_3$) or nitrogen trifluoride ($NF_3$) with and without combination of argon (Ar), krypton (Kr), xenon (Xe), hydrogen ($H_2$), oxygen ($O_2$), nitrogen ($N_2$), ammonia ($NH_3$). By using GCIB vertical etching and a low thermal budget, e.g., room temperature, a small contact CD is maintained by minimizing lateral etching of contact sidewall material. The low thermal budget in this scheme also enhances the reliability and overall robustness of the resulting device. Steps 207 through 227 follow the same process as steps 107 through 127 of FIG. 1A, respectively.

Figure 3:
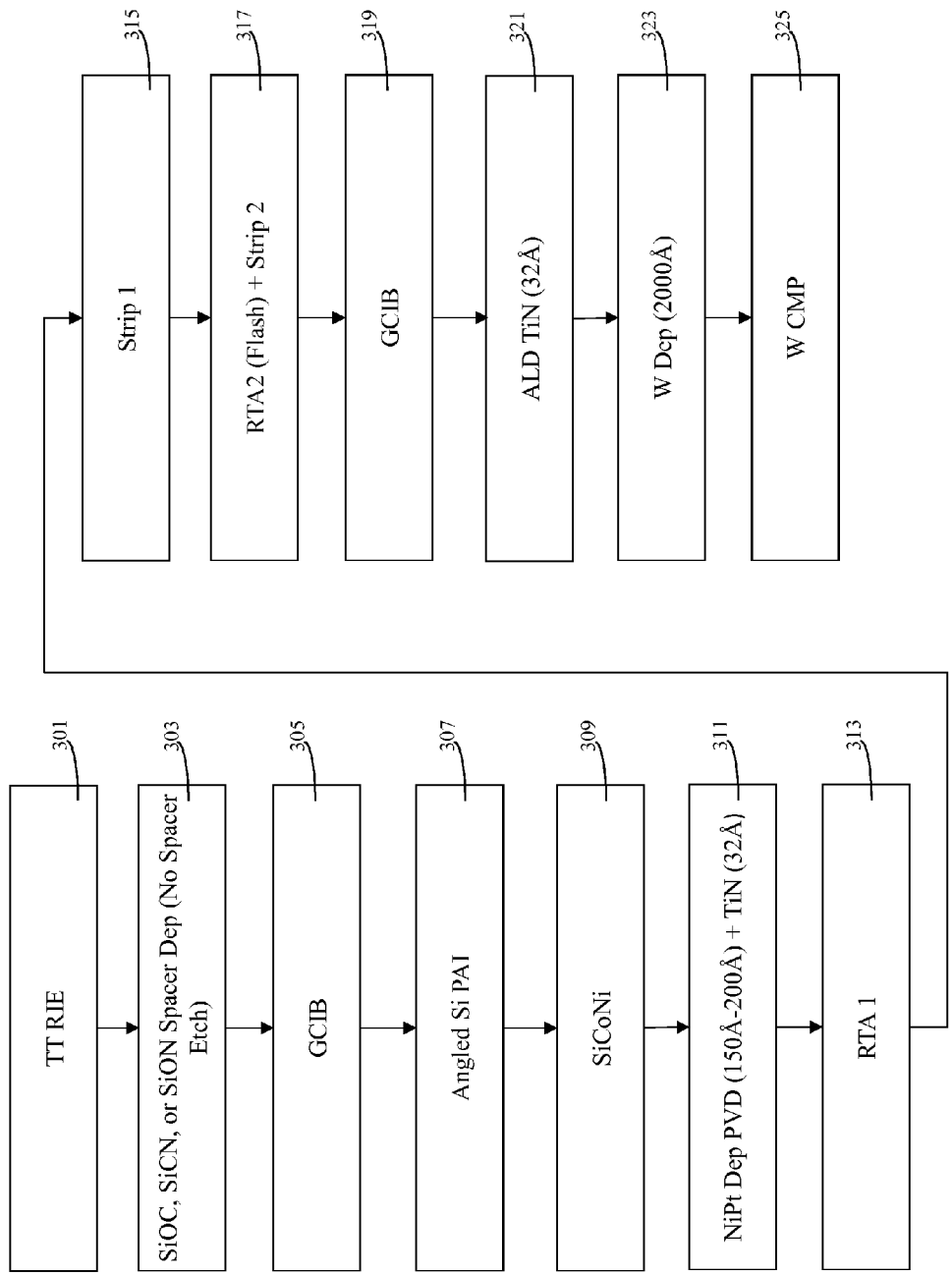
FIG. 3 illustrates a contact metallization flow in MOL with a contact etch scheme to minimize lateral etching and an enhanced W gap-fill, in accordance with another exemplary embodiment.

Adverting to FIG. 3, a contact metallization flow in MOL with a contact etch scheme to minimize lateral etching is illustrated with an enhanced W gap-fill, in accordance with another exemplary embodiment. The steps of FIG. 3 are nearly identical to the steps of FIG. 2, except the Ti layer formed in step 221 of FIG. 2 is eliminated in FIG. 3. Eliminating the Ti layer gives additional room for W fill, which reduces W film adhesion failure by completely eliminating the occurrence of the "volcano" defect. In addition, because the resistivity of W is less than the resistivity of Ti, by having one less film in the stack, the overall resistance of the TS contact and line resistance are reduced. For example, the reduction of resistance based on the removal of the Ti layer may be 10-25%.

Figure 4:
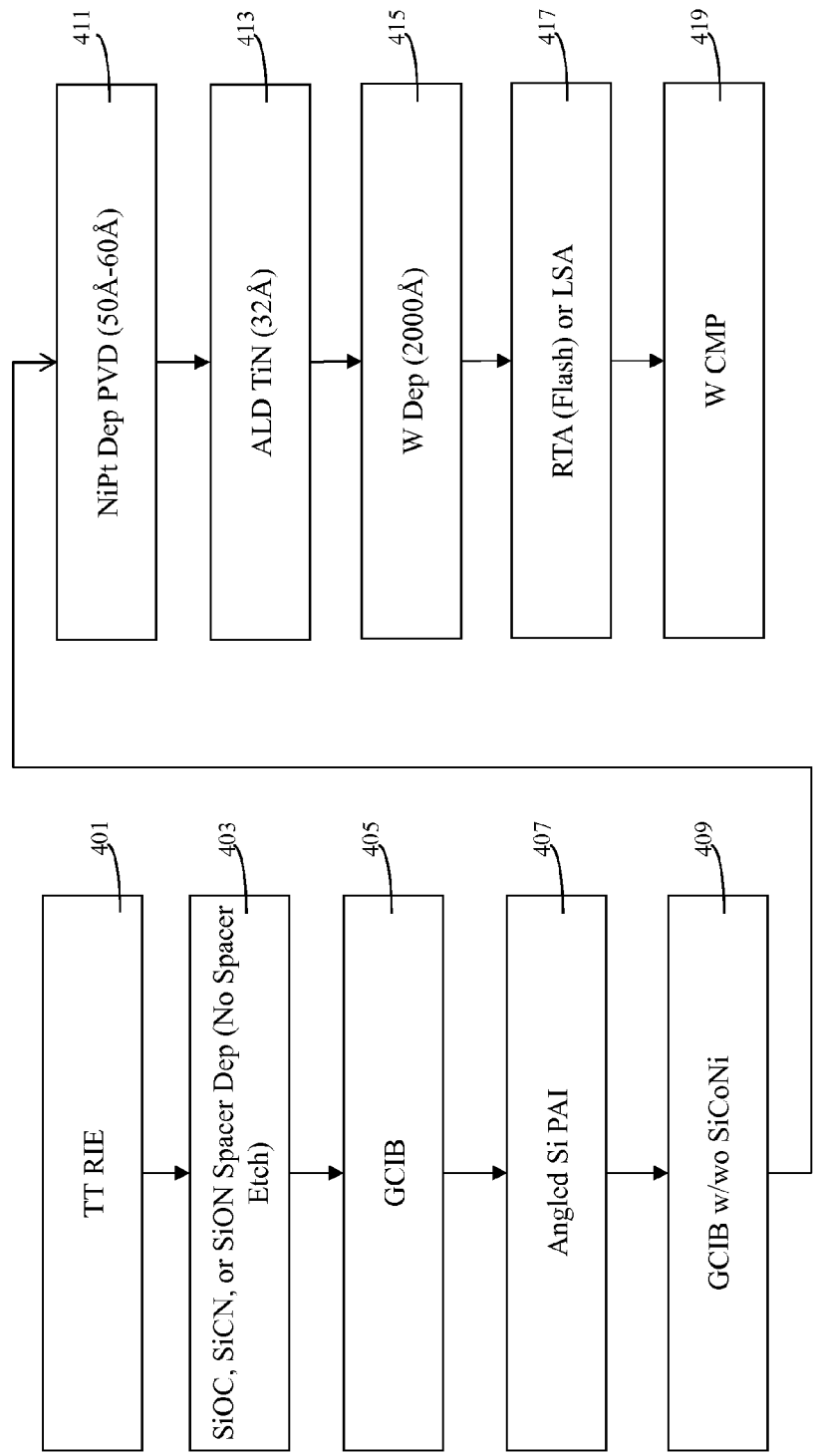
FIG. 4 illustrates a contact metallization flow in MOL with a contact etch scheme to minimize lateral etching and with a simplified NiSi formation and contact fill process, in accordance with another exemplary embodiment.

FIG. 4 illustrates a contact metallization flow in MOL with a contact etch scheme to minimize lateral etching, but with a simplified NiSi formation and contact fill process, in accordance with a further exemplary embodiment. Steps 401 and 403 of FIG. 4 are the same as steps 201 through 205 of FIG. 2. In step 407, similar to step 207 of FIG. 2, an a-Si implantation into the TT is performed by angled PAI. In step 409, a second GCIB etching is performed with or without a SiCoNi™ etching. In step 411, in contrast to steps 111, 211, and 311 of FIGS. 1A, 2 and 3, respectively, the NiPt deposited in the TT by PVD is formed to a thickness of 50 Å to 60 Å rather than to a thickness of 150 Å to 200 Å. The thinner NiPt deposition in step 411 enables greater diffusion control and process variability and defects due to different wet etch chemistries (Strip1 and Strip 2) are eliminated by removing them post first RTA and second RTA anneals during silicide formation. In step 413, TiN is again deposited in the TT by ALD to a thickness of 32 Å. This also facilitates incorporation of the subsequent W CMP process. In step 415, the remainder of the TT is filled with W, e.g., to a thickness of 1500 Å to 2000 Å. The TT is filled with W in step 415 at a temperature, for example, of 250° C. to 400° C. for 150 s to 300 s, which provides the necessary thermal budget for NiSi formation. Accordingly, in FIG. 4, only one RTA (conventional or Flash) or LSA is required, as shown in step 417, as opposed to two RTAs being performed in each of FIGS. 1A, 2, and 3. In particular, RTA1 in steps 113, 213, and 313 of FIGS. 1A, 2, and 3, respectively, is performed at 260° C. for 20 s and RTA2 in steps 117, 217, and 317 of FIGS. 1A, 2, and 3, respectively, is performed at 420° C. for 30 s. In contrast, the single RTA of step 417 of FIG. 4 is a laser-based anneal performed at 700° C. to 850° C. for 0.25 ms to 1.0 ms or RTA at 450° C. to 550° C. for 2 s to 10 s. In step 419, the W is planarized, e.g., by CMP.

Figure 5:
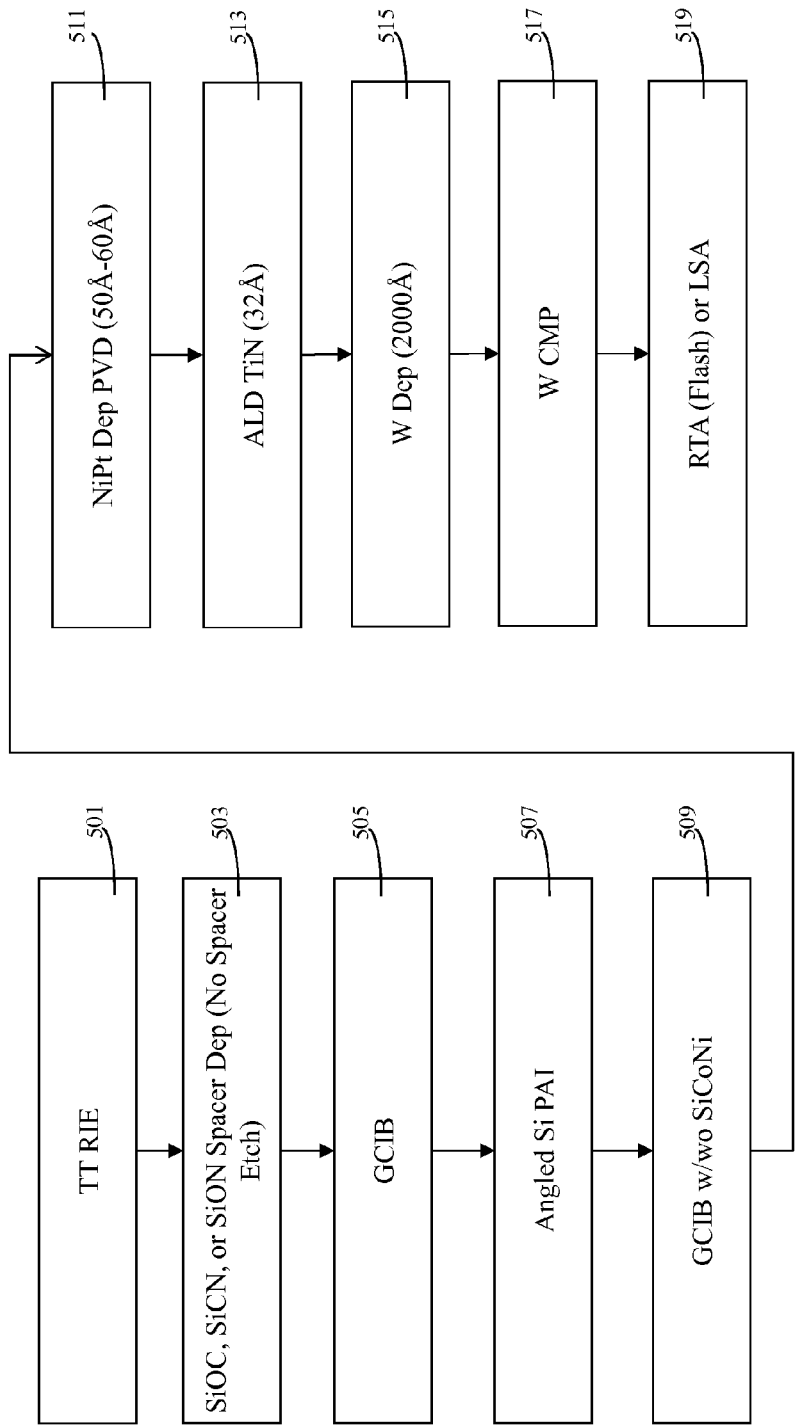
FIG. 5 illustrates a contact metallization flow in MOL with a contact etch scheme to minimize lateral etching and with an alternative simplified NiSi formation and contact fill process, in accordance with an exemplary embodiment.

FIG. 5 illustrates a contact metallization flow in MOL with a contact etch scheme to minimize lateral etching similar to that of FIG. 4, but with an alternative simplified NiSi formation and contact fill process, in accordance with another exemplary embodiment. The steps of FIG. 5 are nearly identical to the steps of FIG. 4; however, unlike in steps 417 and 419 of FIG. 4, in step 517, the filled W is planarized, e.g., by CMP, before the RTA (conventional/Flash) or LSA is performed in step 519.

Figure 6B:
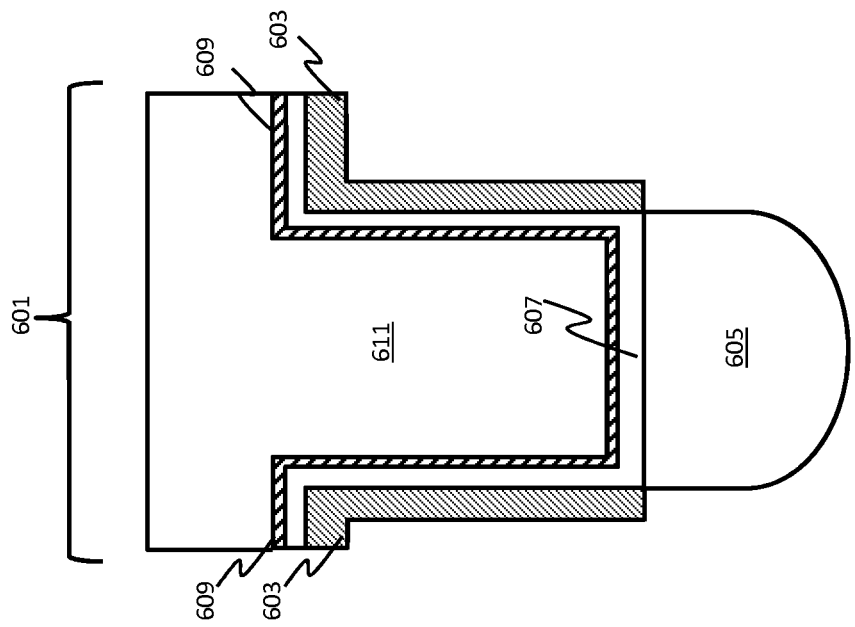
FIGS. 6A and 6B schematically illustrate the contact metallization flows of FIGS. 4 and 5, in accordance with an exemplary embodiment.
Figure 6A:
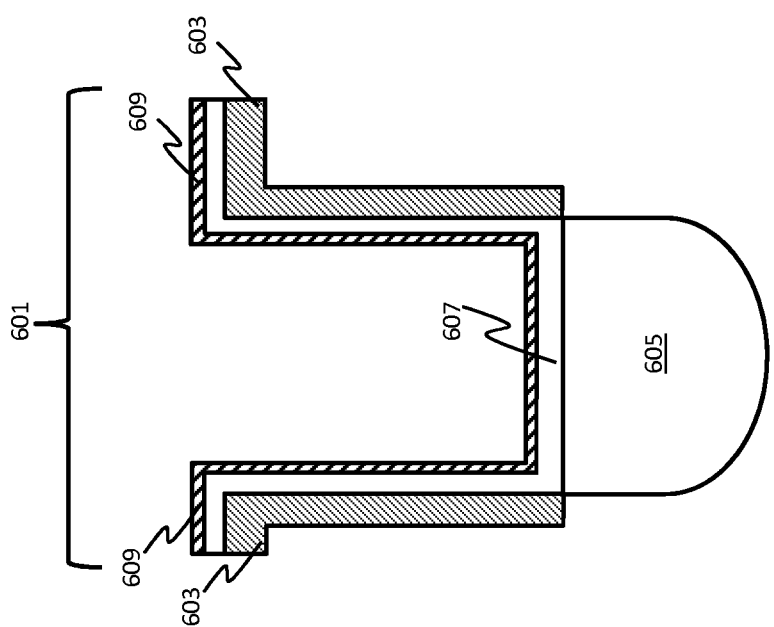

FIGS. 6A and 6B schematically illustrate the contact metallization flows in MOL of FIGS. 4 and 5. Adverting to FIG. 6A, a TT 601 is formed through an ILD (not shown for illustrative convenience) down to S/D regions by RIE. Next, a SiOC, SiCN, or SiON layer 603 is formed on side surfaces of the TT 601. A GCIB vertical etching is then performed at a 0° angle. Next, an a-Si implantation into the TT 601 by angled PAI forms a Si PAI layer 605. Thereafter, a second GCIB etching step is performed with or without a SiCoNi™ etching. In contrast to the FIG. 1B, a NiPt layer 607 is formed, for example, to a thickness of 60 Å rather than to a thickness of 150 Å. Next, a TiN layer 609 is deposited in the TT 601 by ALD to a thickness of 32 Å. Adverting to FIG. 6B, the remainder of the TT 601 is filled with a W layer 611, e.g., to a thickness of 1500 Å to 2000 Å. After the TT 601 is filled with the W layer 611, either an RTA (conventional/Flash) or LSA may be performed and then the W layer 611 planarized, e.g., by CMP, as in FIG. 4 or the W layer 611 may be planarized and then an RTA (conventional/Flash) or LSA is performed as in FIG. 5.

Figure 7:
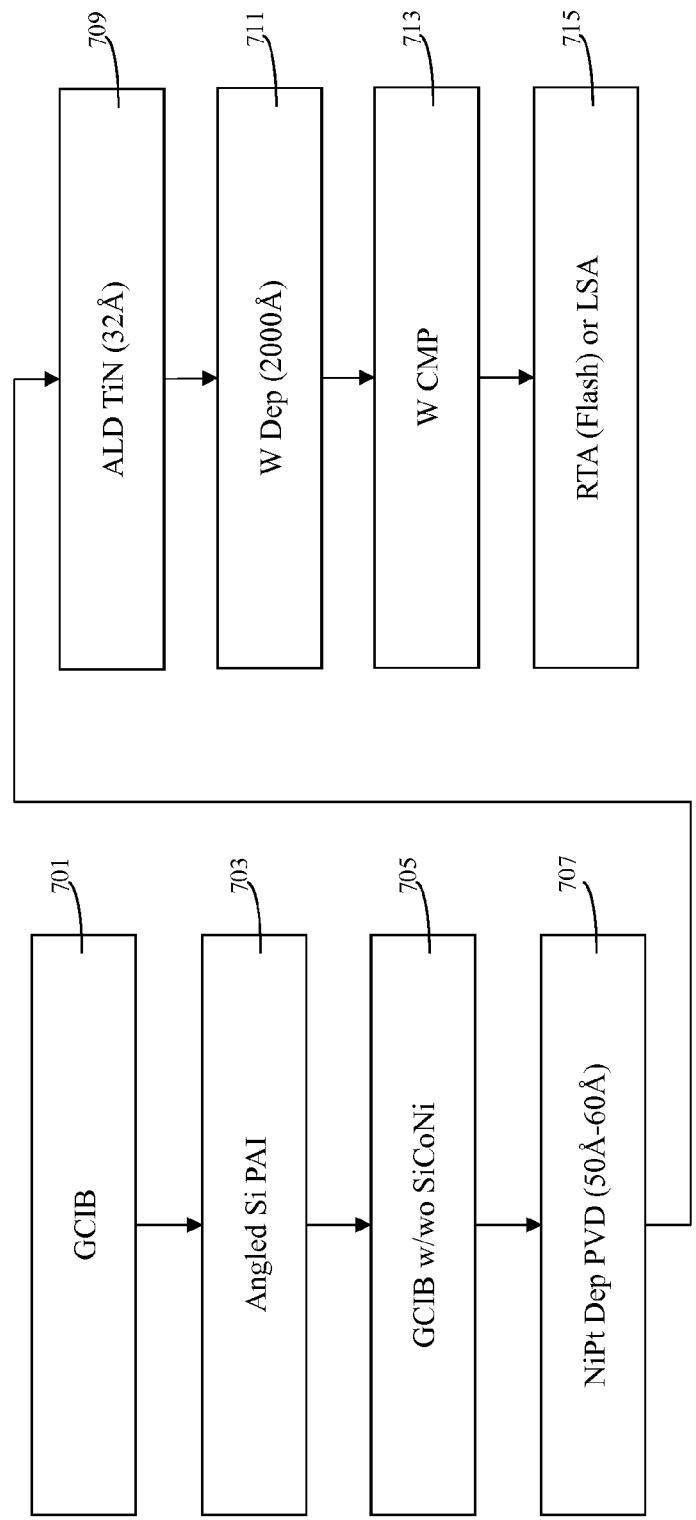
FIG. 7 illustrates a contact metallization flow in MOL that combines the flows of FIGS. 2 through 5, in accordance with an exemplary embodiment.

Adverting to FIG. 7, a contact metallization flow in MOL that combines the flows of FIGS. 2 through 5 is illustrated, in accordance with another exemplary embodiment. In step 701, the TT is formed through an ILD by GCIB etching at a 0° angle. The use of GCIB allows the step pertaining to the formation of a SiOC, SiCN, or SiON layer on the side surfaces of the TT, e.g., steps 103, 203, 303, 403, and 503 of FIGS. 1A, 2, 3, 4, and 5, respectively, to be eliminated in FIG. 7. In the prior art and the previously described embodiments, the SiOC spacer is added to narrow down the TS and, therefore, improve device performance, yield and reliability and reduce TS-PC shorts. However, to form the silicide, the SiOC spacer needs to be opened up to epitaxial (epi) growth by an Ar sputter and SiCoNi™ combination, which is used to clean up the epi and NiPt interface. These precleans are known to adversely affect the TS structure causing it to "blow-up" and thereby reduce the distance between the TS and the PC. Whereas the distance in the prior art between gate and contact was 14 nm to 18 nm, the distance between the gate and the contact in FIG. 7 is 22 nm to 26 nm, which results in an improvement in effective capacitance between 3-10%. The remaining steps of FIG. 7, steps 703 through 715, are the same as steps 507 through 519 of FIG. 5, respectively.

The embodiments of the present disclosure can achieve several technical effects including improving the contact etching process by using GCIB vertical etching (minimal lateral etching) at a low thermal budget (room temperature). Other improvements include improving gap-fill capability and, therefore, eliminating voids, the Ti layer, and "volcano" defects, which help to extend the metallization scheme with reduced CDs. Additional improvements include the TS contact having slightly more volume of W, which improves device line and contact resistance since W has lower resistivity than Ti. Further improvements include a simplified MOL contact metallization stack, which leads to device yield improvement as well as cost savings due to thinner NiPt, no additional wet etch processes are needed. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial application in any of various types of semiconductor devices, particularly for sub-20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a trench contact (TT) through an interlayer dielectric (ILD) down to a source/drain region;
   forming a silicon oxycarbide (SiOC), silicon carbon nitride (SiCN), or silicon oxynitride (SiON) layer on side surfaces of the TT;
   performing a gas cluster ion beam (GCIB) vertical etching at a 0° angle;
   implanting silicon (Si) into the TT by an angled pre-amorphous implantation (PAI);
   removing a portion of the TT by Ar sputtering and a remote plasma assisted dry etch process;
   forming nickel silicide (NiSi) on the source/drain (S/D) region at the bottom of the TT by:
      depositing nickel platinum (NiPt) in the TT by plasma vapor deposition;
      depositing titanium nitride (TiN) in the TT; and
      performing a first rapid thermal anneal (RTA) 260° C. for 20 s and a second RTA at 420° C. for 30 s; and
   filling the TT with contact metal over the NiSi.

2. The method according to claim 1, comprising forming the TT by reactive ion etching (RIE).

3. The method according to claim 1, comprising filling the TT with contact metal by:
   performing Ar sputtering;
   forming a titanium (Ti) layer in the TT by plasma vapor deposition;
   forming a TiN layer in the TT by atomic layer deposition (ALD);
   filling a remainder of the TT with tungsten (W); and
   planarizing the W.

4. The method according to claim 1, comprising filling the TT with contact metal by:
   performing Ar sputtering with GCIB;
   forming a TiN layer in the TT by ALD;
   filling a remainder of the TT with W; and
   planarizing the W.

5. The method according to claim 1, further comprising planarizing the W after the RTA and LSA.

6. A method comprising:
   forming a trench contact (TT) through an interlayer dielectric (ILD) down to a source/drain region;
   forming a silicon oxycarbide (SiOC), silicon carbon nitride (SiCN), or silicon oxynitride (SiON) layer on side surfaces of the TT;
   performing a first gas cluster ion beam (GCIB) etching at a 0° angle;
   implanting silicon (Si) into the TT by an angled pre-amorphous implantation (PAI);
   performing a second GCM etching with SiCONi etching;
   depositing nickel platinum (NiPt) in the TT by plasma vapor deposition;
   depositing titanium nitride (TiN) in the TT;
   filling a remainder of the TT with tungsten (W); and
   performing a rapid thermal anneal (RTA) and a laser-based surface anneal (LSA).

7. The method according to claim 6, comprising forming the TT by reactive ion etching (RIE).

8. The method according to claim 6, comprising forming the NiPt layer to a thickness of 50 angstroms (Å) to 60 Å.

9. The method according to claim 6, comprising filling the TT with W at a temperature of 250° C. to 400° C.

10. The method according to claim 9, comprising filling the TT with W at the temperature for 150 seconds (s) to 300 s.

11. The method according to claim 6, comprising performing the RTA at 700° C. to 850° C. for 0.25 milliseconds (ms) to 1.0 ms.

12. The method according to claim 6, further comprising planarizing the W before performing the RTA and LSA.

13. A method comprising:
   forming a trench contact (TT) in a substrate by gas cluster ion beam (GCIB) etching at a 0° angle;
   implanting silicon (Si) into the TT by an angled pre-amorphous implantation (PAI);
   performing a second GCIB etching;
   depositing nickel platinum (NiPt) in the TT by plasma vapor deposition;
   depositing a titanium nitride (TiN) layer on side surfaces of the TT;
   filling the TT with tungsten (W) at a temperature of 250° C. to 400° C.;
   planarizing the W; and
   performing rapid thermal anneal (RTA) and laser based surface anneal (LSA).

14. The method according to claim 13, comprising performing the second GCIB etching with a remote plasma assisted dry etch process.

15. The method according to claim 13, comprising depositing the NiPt to a thickness of 50 angstroms (Å) to 60 Å.

16. The method according to claim 13, comprising filling the TT with W at the temperature for 150 seconds (s) to 300 s.

17. The method according to claim 13, comprising performing the RTA at 700° C. to 850° C. for 0.25 milliseconds (ms) to 1.0 ms.

* * * * *